US012690264B2

(12) United States Patent
Hong et al.

(10) Patent No.: US 12,690,264 B2
(45) Date of Patent: Jul. 21, 2026

(54) PJ JUNCTION DEVICE STRUCTURE IN SEMICONDUCTOR DEVICE WITH BACK SIDE POWER DELIVERY NETWORK (BSPDN) STRUCTURE

(71) Applicant: SAMSUNG ELECTRONICS CO., LTD., Suwon-si (KR)

(72) Inventors: Byounghak Hong, Latham, NY (US); Sooyoung Park, Halfmoon, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 767 days.

(21) Appl. No.: 17/738,743

(22) Filed: May 6, 2022

(65) Prior Publication Data

US 2023/0275084 A1    Aug. 31, 2023

Related U.S. Application Data

(60) Provisional application No. 63/314,738, filed on Feb. 28, 2022.

(51) Int. Cl.
H10D 84/80        (2025.01)
H10D 84/01        (2026.01)
        (Continued)

(52) U.S. Cl.
CPC ....... H10D 84/811 (2025.01); H10D 84/0149 (2025.01); H10D 84/038 (2025.01);
        (Continued)

(58) Field of Classification Search
CPC ............. H10D 84/811; H10D 84/0149; H10D 84/038; H10D 84/201; H10D 84/948; H10D 88/00; H10D 88/01; H01L 23/50; H01L 23/5286; H01L 23/5226; H01L 23/5283; H01L 23/535; A01G 13/39; A61K 40/4218; H02K 15/027; H02K 15/90; H10H 20/826; B01D 15/222; H10F 77/169; H10F 10/18; B82Y 10/00; C01G 53/82
See application file for complete search history.

(56) References Cited

U.S. PATENT DOCUMENTS

| | | | |
|---|---|---|---|
| 2013/0043537 A1* | 2/2013 | Arai .................... | H10F 39/8037 |
| | | | 438/149 |
| 2018/0145030 A1 | 5/2018 | Beyne et al. | |

(Continued)

OTHER PUBLICATIONS

Communication issued on Jul. 18, 2023 by the European Patent Office for European Patent Application No. 23157593.7.

*Primary Examiner* — Fernando Toledo
*Assistant Examiner* — Marshall Mu-Nuo Hatfield
(74) *Attorney, Agent, or Firm* — Myers Bigel, P.A.

(57) ABSTRACT

Provided is a semiconductor device that includes: at least one field-effect transistor and at least one PN junction device at a lateral side of the at least one field-effect transistor in a $1^{st}$ layer; and at least one back side power delivery network (BSPDN) structure in a $2^{nd}$ layer below the $1^{st}$ layer, wherein the at least one BSPDN structure is configured to connect the at least one field-effect transistor to a voltage source.

13 Claims, 12 Drawing Sheets

(51) Int. Cl.
    *H10D 84/03*        (2025.01)
    *H10D 88/00*        (2026.01)
    *H10W 72/00*        (2026.01)

(52) U.S. Cl.
    CPC ............. *H10D 88/00* (2025.01); *H10D 88/01*
              (2025.01); *H10W 72/00* (2026.01)

(56)           References Cited

U.S. PATENT DOCUMENTS

| | | | |
|---|---|---|---|
| 2019/0214490 A1* | 7/2019 | Leendertz | H10D 64/513 |
| 2020/0258881 A1 | 8/2020 | Lilak et al. | |
| 2020/0303509 A1 | 9/2020 | Mehandru et al. | |
| 2021/0066378 A1* | 3/2021 | Tsai | H10F 39/011 |
| 2021/0305809 A1 | 9/2021 | Hung et al. | |
| 2021/0336019 A1 | 10/2021 | Su et al. | |
| 2021/0358850 A1 | 11/2021 | Chen | |
| 2021/0359091 A1 | 11/2021 | Hsu et al. | |
| 2021/0375761 A1 | 12/2021 | Chang et al. | |
| 2021/0391320 A1 | 12/2021 | Wang et al. | |
| 2022/0028758 A1 | 1/2022 | Song et al. | |
| 2022/0028895 A1 | 1/2022 | Kim et al. | |
| 2022/0415877 A1* | 12/2022 | Orr | H10D 84/0149 |
| 2023/0069107 A1* | 3/2023 | Wei | H10D 89/921 |
| 2023/0170297 A1* | 6/2023 | Chen | H01L 23/5286 |
| | | | 257/774 |

* cited by examiner

FIG. 5

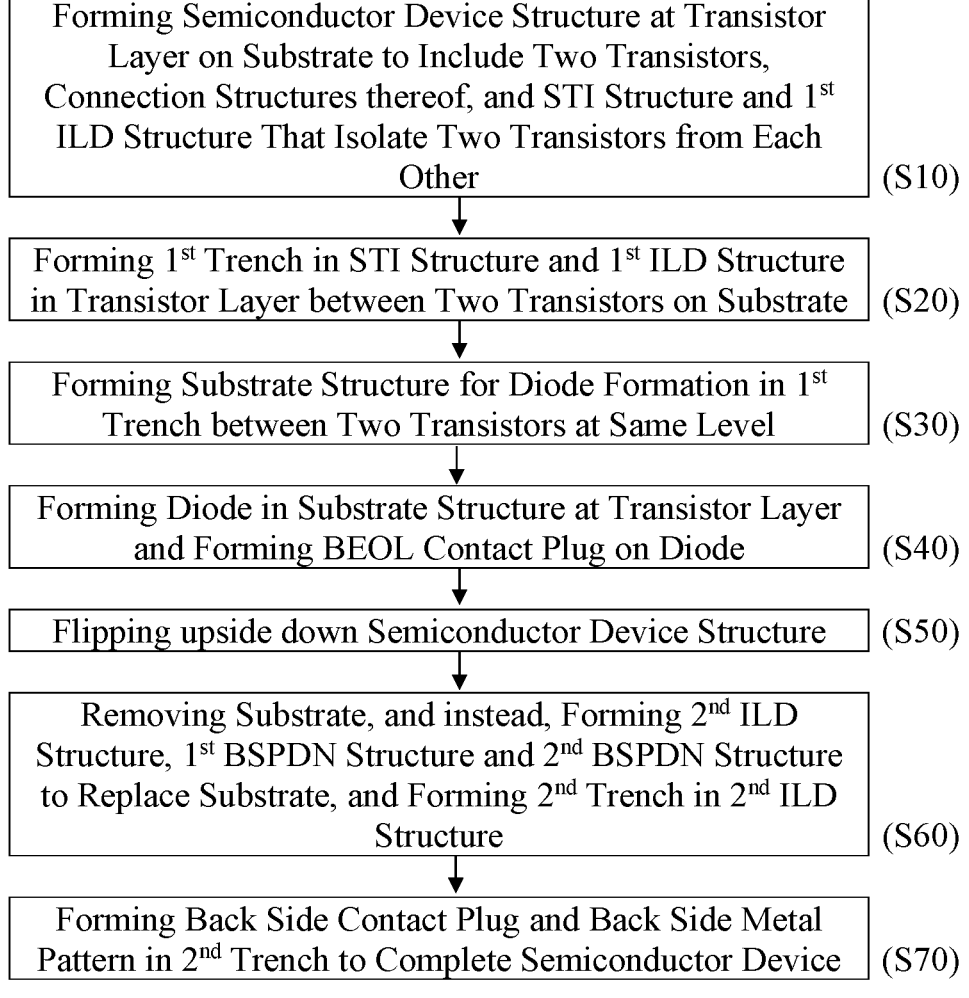

Forming Semiconductor Device Structure at Transistor Layer on Substrate to Include Two Transistors, Connection Structures thereof, and STI Structure and 1$^{st}$ ILD Structure That Isolate Two Transistors from Each Other | (S10)

Forming 1$^{st}$ Trench in STI Structure and 1$^{st}$ ILD Structure in Transistor Layer between Two Transistors on Substrate | (S20)

Forming Substrate Structure for Diode Formation in 1$^{st}$ Trench between Two Transistors at Same Level | (S30)

Forming Diode in Substrate Structure at Transistor Layer and Forming BEOL Contact Plug on Diode | (S40)

Flipping upside down Semiconductor Device Structure | (S50)

Removing Substrate, and instead, Forming 2$^{nd}$ ILD Structure, 1$^{st}$ BSPDN Structure and 2$^{nd}$ BSPDN Structure to Replace Substrate, and Forming 2$^{nd}$ Trench in 2$^{nd}$ ILD Structure | (S60)

Forming Back Side Contact Plug and Back Side Metal Pattern in 2$^{nd}$ Trench to Complete Semiconductor Device | (S70)

FIG. 7

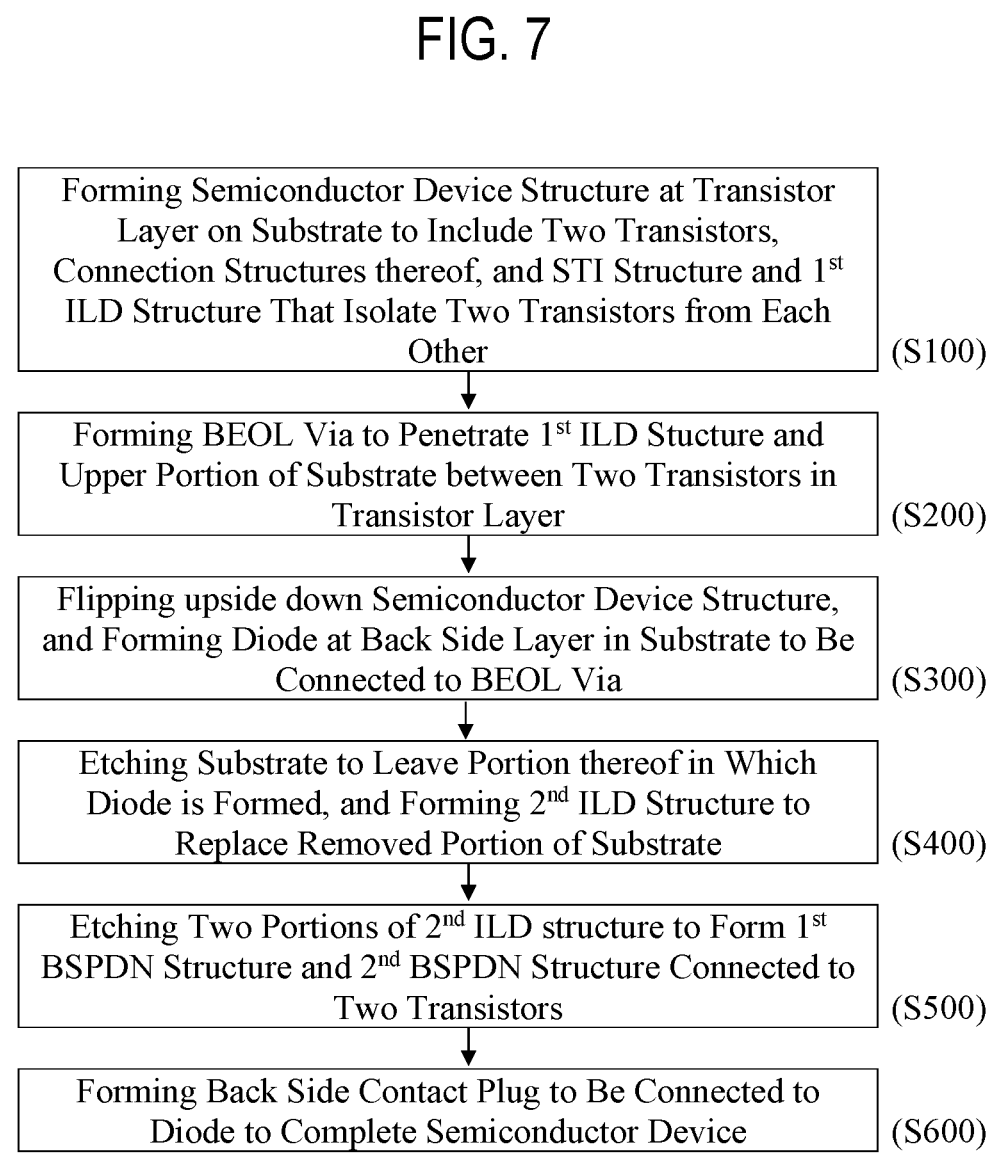

Forming Semiconductor Device Structure at Transistor Layer on Substrate to Include Two Transistors, Connection Structures thereof, and STI Structure and 1st ILD Structure That Isolate Two Transistors from Each Other    (S100)

Forming BEOL Via to Penetrate 1st ILD Stucture and Upper Portion of Substrate between Two Transistors in Transistor Layer    (S200)

Flipping upside down Semiconductor Device Structure, and Forming Diode at Back Side Layer in Substrate to Be Connected to BEOL Via    (S300)

Etching Substrate to Leave Portion thereof in Which Diode is Formed, and Forming 2nd ILD Structure to Replace Removed Portion of Substrate    (S400)

Etching Two Portions of 2nd ILD structure to Form 1st BSPDN Structure and 2nd BSPDN Structure Connected to Two Transistors    (S500)

Forming Back Side Contact Plug to Be Connected to Diode to Complete Semiconductor Device    (S600)

PJ JUNCTION DEVICE STRUCTURE IN SEMICONDUCTOR DEVICE WITH BACK SIDE POWER DELIVERY NETWORK (BSPDN) STRUCTURE

CROSS-REFERENCE TO RELATED APPLICATION

This application is based on and claims priority from U.S. Provisional Application No. 63/314,738 filed on Feb. 28, 2022 in the U.S. Patent and Trademark Office, the disclosure of which is incorporated herein in its entirety by reference.

BACKGROUND

1. Field

Apparatuses and methods consistent with example embodiments of the disclosure relate to a PN junction device formed in a back side thinning process for a semiconductor device, and more particularly, to a passive device or a PN junction device formed together with one or more field-effect transistors formed through a back side thinning process in which a back side power delivery network (BSPDN) is formed in a back side of a semiconductor device including the transistors.

2. Description of the Related Art

Aback side thinning process has been introduced to address a routing complexity at a back-end-of-line (BEOL) of one or more transistors such as fin field-effect transistor (FinFET) and/or nanosheet transistor which is also referred to as a multi-bridge channel field-effect transistor (MBCFET). By this process of manufacturing a semiconductor device including the transistors, one or more metal patterns for power delivery to the transistors may be formed in a back side of the transistors which is opposite to a BEOL side of the transistors. As these metal patterns are formed in the back side of the transistors, they may be referred to as a BSPDN or a BSPDN structure, and the back side thinning process may be referred to as a BSPDN process.

Here, the back side of the transistors may be a place in which a substrate of the transistors are formed. After front-end-of-line (FEOL) structures including one or more fin structures and source/drain regions are epitaxially grown from the substrate, the substrate including, for example, silicon (Si) are removed through the back side thinning process.

However, the substrate is also an element in which one or more passive devices or PN junction devices such as diodes and vertical PNP transistors can be formed to complete a semiconductor device including the transistors. As this substrate is at least partially removed to provide for the BSPDN structure, a semiconductor device with the BSPDN structure may lack a sufficient space to form such devices.

Thus, there is demand of an improved semiconductor device structure addressing the above problems and a method of manufacturing the same.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides a semiconductor device including a back side power delivery network (BSPDN) structure in which a passive device or a PN junction device is included in a transistor layer wherein transistors are formed.

The disclosure also provides a semiconductor device including a back side power delivery network (BSPDN) structure in which a passive device or a PN junction device is included in a transistor layer.

Further, the disclosure provides methods of manufacturing these BSPDN semiconductor devices.

According to embodiments, there is provided a semiconductor device which may include: at least one field-effect transistor and at least one PN junction device at a lateral side of the at least one field-effect transistor in a $1^{st}$ layer; and at least one BSPDN structure in a $2^{nd}$ layer below the $1^{st}$ layer, wherein the at least one BSPDN structure is configured to connect the at least one field-effect transistor to a voltage source.

According to embodiments, there is provided a semiconductor device which may include: at least one field-effect transistor in a $1^{st}$ layer; and at least one BSPDN structure and at least one PN junction device at a lateral side of the at least one BSPDN structure in a $2^{nd}$ layer below the $1^{st}$ layer, wherein the at least one BSPDN structure is configured to connect the at least one field-effect transistor to a voltage source.

According to embodiments, there is provided a method of manufacturing a semiconductor device, which may include: providing at least one field-effect transistor in a $1^{st}$ layer above a substrate in a $2^{nd}$ layer; forming at least one PN junction device at a lateral side of the at least one field-effect transistor in the $1^{st}$ layer; and forming at least one back side power delivery network (BSPDN) structure in the $2^{nd}$ layer, the at least one BSPDN structure being connected to the at least one field-effect transistor.

According to embodiments, there is provided a method of manufacturing a semiconductor device, which may include: providing at least one field-effect transistor in a $1^{st}$ layer above a substrate in a $2^{nd}$ layer; forming at least one PN junction device in the substrate in the $2^{nd}$ layer; and forming at least one BSPDN structure at a later side of the at least one PN junction device in the $2^{nd}$ layer, the at least one BSPDN structure being connected to the at least one field-effect transistor.

BRIEF DESCRIPTION OF DRAWINGS

Example embodiments of the disclosure will be more clearly understood from the following detailed description taken in conjunction with the accompanying drawings in which:

FIG. 5 illustrates a flowchart of the method described in reference to FIGS. 4A to 4G, according to embodiments;

FIG. 7 illustrates a flowchart of the method described in reference to FIGS. 6A to 6F, according to embodiments.

DETAILED DESCRIPTION OF EMBODIMENTS

Figure 1:
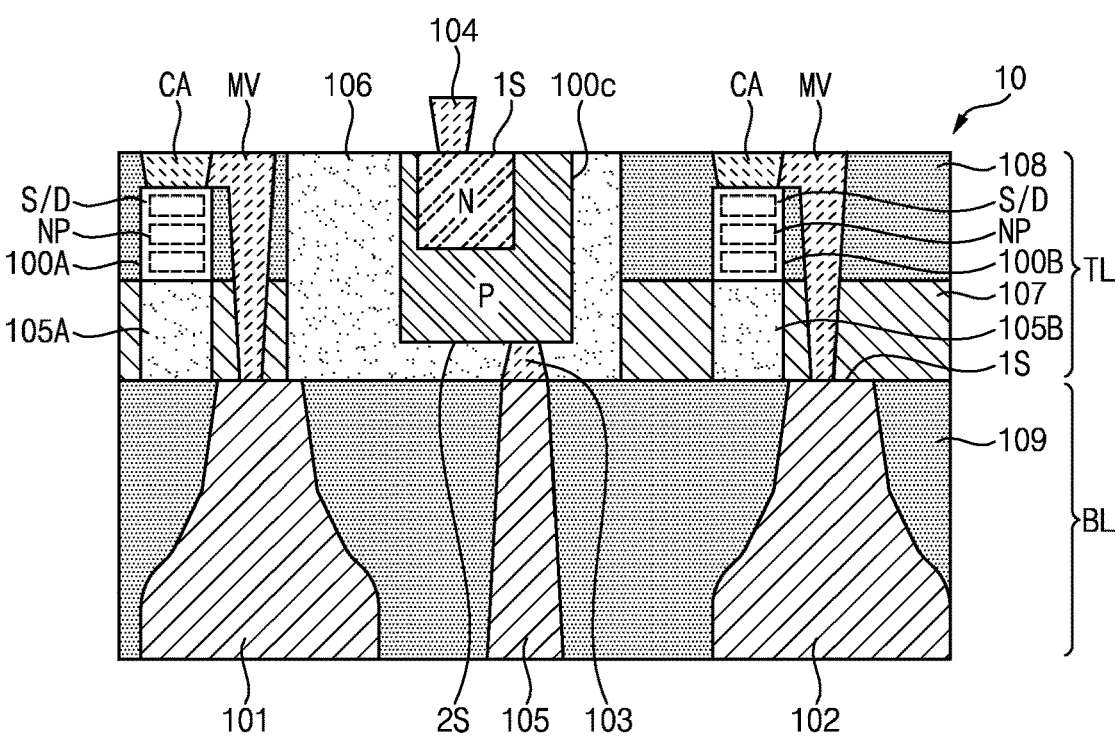
FIG. 1 illustrates a cross-section view of a semiconductor device including two transistors and a PN junction device above a back side power delivery network (BSPDN) structure, according to an embodiment.

The embodiments described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a material or materials forming a metal pattern, a via or super via may not be limited to metals of which examples are taken herein as long as the disclosure can be applied thereto. Further, the use of the super via scheme described herein may not be limited to the BEOL of a semiconductor device, and instead, may be applied to a different structure or device.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "upper," "lower," "top," "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is flipped upside town or turned over, elements described as "below" or "beneath" other elements would then be oriented "above" the other elements, and a "top" or "upper" surface of an element would be a "bottom" or "lower" surface of the element. Thus, for example, the term "below" can encompass both an orientation of above and below, and the term "top" can encompass both a position of top and bottom, subject to the corresponding situation. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c" should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, some conventional elements of a transistor, that is, front-end-of-line (FEOL) structures, and connection structures of the transistor, that is, back-end-of-line (BEOL) structures and middle-of-line (MOL) structures may or may not be described in detail herein or shown in the drawings. For example, a barrier metal line formed in a via hole or a trench before a via or a metal structure that may be formed therein and an etch stop layer formed between two vertically adjacent layers may not be described or shown.

FIG. 1 illustrates a cross-section view of a semiconductor device including two transistors and a PN junction device above a back side power delivery network (BSPDN) structure, according to an embodiment.

It is understood here that FIG. 1 (also FIGS. 2, 3, 4A-4G and 6A-6F) shows a cross-section of a semiconductor device in a channel-width direction, and a gate structure of each transistor included in the semiconductor device is not shown in the drawings for brevity purposes.

Referring to FIG. 1, a semiconductor device 10 may include a plurality of semiconductor elements at two layers, that is, a transistor layer TL and a back side layer BL. In the transistor layer, a $1^{st}$ transistor 100A and a $2^{nd}$ transistor 100B may be formed on a $1^{st}$ substrate structure 105A and a $2^{nd}$ substrate structure 105B, respectively. The two transistors 100A and 100B may be disposed at a substantially same level in the transistor layer TL.

The semiconductor device 10 may further include, in the transistor layer TL, a diode 100C at a lateral side of the $1^{st}$ transistor 100A or the $2^{nd}$ transistor 100B, or laterally between the two transistors 100A and 100B in the transistor layer TL, according to an embodiment. The diode 100C may be formed inside a $3^{rd}$ substrate structure 106, and may be disposed to be at a substantially same level as the two transistors 100A and 100B, according to an embodiment. In the present embodiment, the diode 100C may be buried in the $3^{rd}$ substrate structure 106 with its $1^{st}$ surface 1S exposed to a front or outside of the semiconductor device 10. Further, another type of passive device or PN junction device different from the diode 100C may be formed in the $3^{rd}$ substrate structure 106, according to embodiments.

The $1^{st}$ substrate structure 105A, the $2^{nd}$ substrate structure 105B and the $3^{rd}$ substrate structure 106 each may be formed of a semiconductor material, for example, silicon (Si), or may be part of a silicon-on-insulator (SOI) substrate. The $3^{rd}$ substrate structure 106 may be formed of a material that is the same as or different from the material forming the $1^{st}$ substrate structure 105A and the $2^{nd}$ substrate structure 105B. According to an embodiment, the material forming the $3^{rd}$ substrate structure 106 may include amorphous silicon (a-Si), differently from the $1^{st}$ substrate structure 105A and the $2^{nd}$ substrate structure 105B. The $1^{st}$ substrate structure 105A and the $2^{nd}$ substrate structure 105B each may be a structure remaining after forming the two transistors 100A and 100B on an initial substrate and thinning the initial substrate to form the back side layer BL wherein one or more BSPDN structures are to be included, according to an embodiment. In contrast, the $3^{rd}$ substrate structure 106 may be formed separately from the $1^{st}$ substrate structure 105A and the $2^{nd}$ substrate structure 105B to form the diode 100C therein, according to an embodiment. However, the $3^{rd}$ substrate structure 106 may also be a structure remaining after the formation of the two transistors 100A and 100B on the initial substrate and the formation of the BSPDN structures, according to an embodiment.

In the meantime, in order to further increase device density, the substrate structures 105A and 105B may be utilized to implant an additional passive device or PN junction device therein, although not shown in the drawings, according to embodiments. However, according to an embodiment, the substrate structures 105A and 105B may be removed to prevent an undesired diffusion of the semiconductor material forming the substrate structure 105A and 105B toward other circuit elements of the semiconductor device 10.

The $1^{st}$ transistor 100A and the $2^{nd}$ transistor 100B each may be a nanosheet transistor in the illustrated embodiment, however, in other embodiments, different forms of transistor (e.g., extra gate (EG) field-effect transistor (FinFET)) may be used. Each of the transistors 100A and 100B may include a plurality of nanosheet patterns NP stacked above the $1^{st}$ substrate structure 105A and the $2^{nd}$ substrate structure 105B, respectively. The nanosheet patterns NP may function as a channel structure of each of the transistors 100A and 100B. The nanosheet patterns NP may have been epitaxially grown from the initial substrate. Each of the transistors 100A and 100B may also include a source/drain region S/D which may have been epitaxially grown from the initial substrate and the nanosheet patterns NP. The source/drain region S/D may be doped with one or more p-type impurities or n-type impurities according to a type of the transistors 100A and 100B to be formed. The p-type impurities may include boron (B), gallium (Ga), indium (In), aluminum (Al), etc. and the n-type impurities may include phosphorus (P), arsenic (As), and antimony (Sb), etc.

The semiconductor device 10 may further include the $1^{st}$ BSPDN structure 101 and the $2^{nd}$ BSPDN structure 102 formed at the back side of the semiconductor device 10 in the back side layer BL, according to an embodiment. The two BSPDN structures 101 and 102 each may be a metal pattern provided for delivery of a positive or negative voltage to the two transistors 100A and 100B, respectively. For this purpose, a $1^{st}$ surface 1S of each of the two BSPDN structures 101 and 102 may be connected to a source/drain region contact plug CA formed on the source/drain region S/D of each of the two transistors 100A and 100B through an MOL via MV, which may be a via metal pattern formed in the transistor layer TL, according to an embodiment. The MOL via MV connected to the source/drain region contact plug CA may be extended down to the $1^{st}$ surface 1S of each of the two BSPDN structures 101 and 102. A reason for disposing the two BSPDN structures 101 and 102, that may be metal patterns, at the back side of the semiconductor device 10 in the back side layer BL is at least to avoid routing congestion at a BEOL side of the two transistors 100A and 100B, as discussed earlier.

The two BSPDN structures 101 and 102, the source/drain region contact plug CA, and the MOL via MV may be formed of one or more materials selected from among copper (Cu), titanium (Ti), tantalum (Ta), aluminum (Al), tungsten (W), cobalt (Co), molybdenum (Mo), ruthenium (Ru), etc. However, these connection structures may be formed of respectively different materials, according to embodiments.

Active regions of the two transistors 100A and 100B on which the nanosheet patterns NP are formed may be insulated from each other and from other circuit elements including the MOL via MV by a shallow trench isolation (STI) structure 107. The STI structure 107 may be formed of one or more low-k materials such as silicon oxide (SiO), silicon nitride (SiN), silicon oxynitride (SiON), not being limited thereto. The low-k material may have a dielectric constant (k value) that is about 3.9 or less.

Further, a $1^{st}$ interlayer dielectric (ILD) structure 108 may be formed on the STI structure 107 to insulate the source/drain region S/D of the $1^{st}$ transistor 100A from other circuit elements including the source/drain region of the $2^{nd}$ transistor 100B. The $1^{st}$ ILD structure 108 may also include one or more low-k materials the same as or similar to those of the STI structure 107. The MOL via MV described above may penetrate through the $1^{st}$ ILD structure 108 and the STI structure 107 to be connected to the $1^{st}$ surface 1S of each of the two BSPDN structures 101 and 102.

In the present embodiment, the diode 100C, which is a passive device, may be formed at the substantially same level as the two transistors 100A and 100B, which are active devices, as described earlier. For connection of the diode 100C to a voltage source or another circuit element, a back side contact plug 103 and a BEOL contact plug 104 may be formed on the diode 100C, according to an embodiment. The back side contact plug 103 may be formed at the back side of the semiconductor device 10 where the two BSPDN structures 101 and 102 are formed, and the BEOL contact plug 104 may be formed at a side opposite to the back side of the semiconductor device 10 where the source/drain region contact plugs CA of the two transistors 100A and 100B are formed. Here, the BEOL contact plug 104 may also be referred to as an MOL contact plug.

The back side contact plug 103 of the diode 100C may be connected to a back side metal pattern 105 formed in the back side layer BL at a substantially same level as the two BSPDN structures 101 and 102, according to an embodiment. The back side contact plug 103, the BEOL contact plug 104 and the back side metal pattern 105 may be formed of the same material or different materials selected from among Cu, Ti, Ta, Al, W, Co, MO, Ru, etc.

The diode 100C may include a p-region P (anode) and an n-region (cathode) inside the $3^{rd}$ substrate structure 106. According to an embodiment, the p-region P may be first formed by doping one or more p-type impurities at a portion of the $3^{rd}$ substrate structure 106, and then, the n-region N may be formed on another portion of the substrate structure 106 by doping one or more n-type impurities so that the p-region P and the n-region N may contact each other to form a PN junction in the $3^{rd}$ substrate structure 106. However, the diode 100C may be epitaxially grown from the initial substrate, according to an embodiment.

In the semiconductor device 10, the diode 100C may be structured such that a $1^{st}$ surface 1S of the p-region P and a $1^{st}$ surface 1S of the n-region N may be exposed to the front or outside of the semiconductor device 10 as shown in FIG. 1, and may be coplanar with each other. The $1^{st}$ surfaces 1S of the p-region P and the n-region N may also be coplanar with $1^{st}$ surfaces 1S of the $3^{rd}$ substrate structure 106, the $1^{st}$ ILD structure 108, the source/drain region contact plug CA and the MOL via MV of each of the transistors 100A and 100B exposed to the front of outside of the semiconductor device 10 as shown in FIG. 1. However, a $2^{nd}$ surface 2S, opposite to the $1^{st}$ surface 1S, of the p-region P of the diode 100C may be buried in the $3^{rd}$ substrate structure 106

The $2^{nd}$ surface 2S of the p-region P of the diode 100C may be connected to a positive voltage source through the back side contact plug 103 and the back side metal pattern 105, and the $1^{st}$ surface 1S of the n-region N of the diode 100C may be connected to another circuit element (not shown) of the semiconductor device 10 or another device (not shown) through the BEOL contact plug 104.

The semiconductor device 10 may also include a $2^{nd}$ ILD structure 109 formed on the back side of the semiconductor device 10 in the back side layer BL. The $2^{nd}$ ILD structure 109 may insulate the BSPDN structures 101, 102 and the back side metal pattern 105 from one another. The $2^{nd}$ ILD structure 109 may be formed of one or more materials which are the same as or different from those forming the $1^{st}$ ILD structure 108.

According to the above embodiments, the semiconductor device 10 may address the routing congestion at the BEOL side of the semiconductor device 10 by forming the BSPDN structures 101 and 102 at the opposite side, that is, the back side of the semiconductor device 10 in the back side layer BL. In addition, the above embodiments may enable the semiconductor device 10 to utilize a space at a lateral side of the $1^{st}$ transistor 100A or the $2^{nd}$ transistor 100B or between the two transistors 100A and 100B, in the transistor layer TL, that is, above the back side layer BL of the semiconductor device 10.

Although the above embodiments are directed to a structure of two nanosheet transistors and a diode, the disclosure is not limited to these embodiments. Different types of field-effect transistor such as FinFET) may be formed as each of the two transistors 100A and 100B, and also, different types of passive device, PN junction device or bipolar junction transistor (BJT) such as a PNP transistor may be formed at the lateral side of the $1^{st}$ transistor 100A or the $2^{nd}$ transistor 100B or between the two transistors 100A and 100B in the transistor layer TL.

Figure 2:
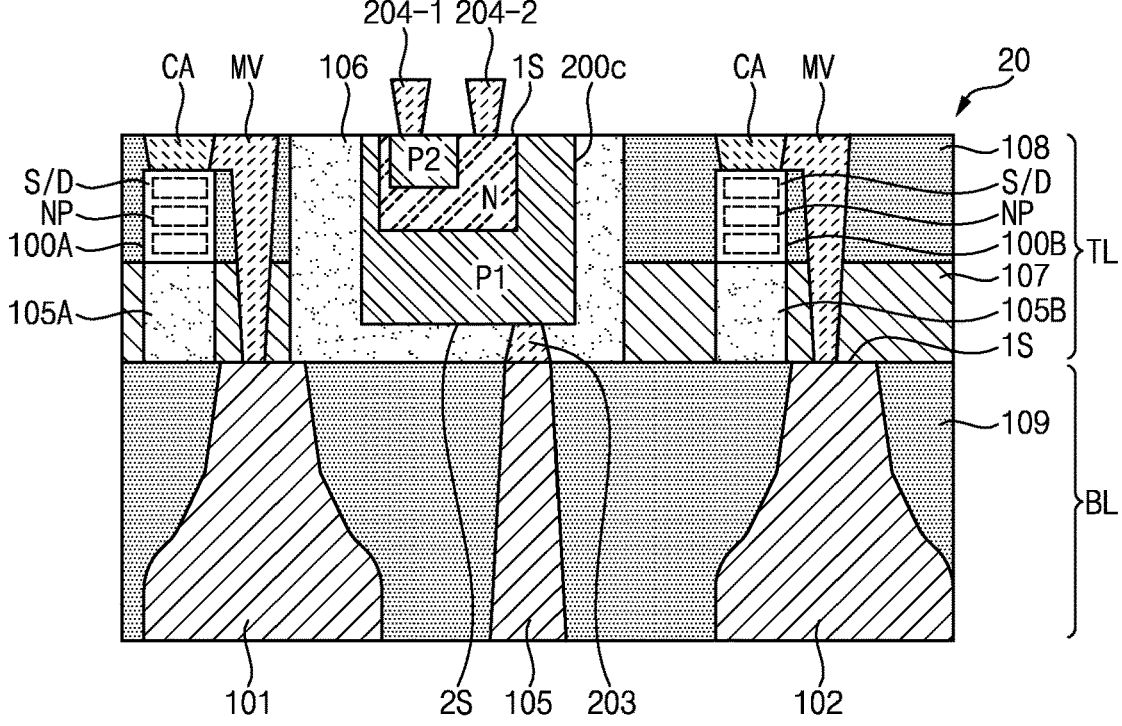
FIG. 2 illustrates a cross-section view of a semiconductor device structure including two transistors and another PN junction device above a BSPDN structure, according to an embodiment.

FIG. 2 illustrates a cross-section view of a semiconductor device structure including two transistors and another PN junction device above a BSPDN structure, according to an embodiment.

Referring to FIG. 2, a semiconductor device 20 according to an embodiment may have the same structural elements included in the semiconductor device 10 of FIG. 1 except that a vertical PNP transistor (vPNP) 200C and connection structures thereof replace the diode 100C and the connection structures thereof included in the semiconductor device 10. Thus, descriptions about the semiconductor device 20 hereinbelow are directed to the vPNP 200C and its connection structures while duplicate descriptions about the same structural elements in the two semiconductor devices 10 and 20 are limited or omitted.

Similar to the semiconductor device 10, the semiconductor device 20 of the present embodiment may include the $1^{st}$ transistor 100A and the $2^{nd}$ transistor 200B formed on the respective substrate structures 105A and 105B. In the semiconductor device 20, however, the vPNP 200C may be disposed at a lateral side of the $1^{st}$ transistor 100A or the $2^{nd}$ transistor 200B, or laterally between the two transistors 100A and 100B in the transistor layer TL. The vPNP 200C may be formed in the $3^{rd}$ substrate structure 106 at a substantially same level as the two transistors 100A and 100B. Like the diode 100C shown in FIG. 1, the vPNP 200C may be buried in the $3^{rd}$ substrate structure 106 with its $1^{st}$ surface 1S exposed to an outside of the semiconductor device 20, according to an embodiment.

The vPNP 200C may include a $1^{st}$ p-region P1, a $2^{nd}$ p-region P2 and an n-region N. Each of the $1^{st}$ p-region P1 and the $2^{nd}$ p-region P2 may be doped with one or more p-type impurities, and the n-region N may be doped with one or more n-type impurities. In the vPNP 200C, the $1^{st}$ p-region and the n-region included inside the p-region P may form a PN junction, and the n-region N and the $2^{nd}$ p-region P2 included in the n-region N may form another PN junction. Like the diode 100C of the semiconductor device 10, the vPNP may also be epitaxially grown in the $3^{rd}$ substrate structure 106 instead of being implanted therein, according to an embodiment.

In the vPNP 200C, $1^{st}$ surfaces 1S of the two p-regions P1, P2 and the n-region N may be exposed to a front or outside of the semiconductor device 20 as shown in FIG. 2, and may be coplanar with one another. The $1^{st}$ surfaces 1S of the two p-regions P1, P2 and the n-region N may also be coplanar with $1^{st}$ surfaces 1S of the $3^{rd}$ substrate structure 106, the $1^{st}$ ILD structure 108, the source/drain region contact plug CA and the MOL via MV of each of the transistors 100A and 100B exposed to the outside of the semiconductor device 20, as shown in FIG. 2. However, a $2^{nd}$ surface 2S of the $1^{st}$ p-region P1 may be buried in the substrate structure 106.

For connection of the vPNP 200C to a voltage source or another circuit element, a back side contact plug 203, a $1^{st}$ BEOL (or MOL) contact plug 204-1 and a $2^{nd}$ BEOL (or MOL) contact plug 204-2 may be formed on the vPNP 200C, according to an embodiment. The back side contact plug 203 may be formed on the $2^{nd}$ surface 2S of the $1^{st}$ p-region P1 at a back side of the semiconductor device 20 where the two BSPDN structures 101 and 102 are formed. The $1^{st}$ BEOL contact plug 204-1 and the $2^{nd}$ BEOL contact plug 204-2 may be formed on the $1^{st}$ surface 1S of the $2^{nd}$ p-region P2 and the $1^{st}$ surface 1S of the n-region N, respectively. These two BEOL contact plugs 204-1 and 204-2 may be disposed at a side opposite to the back side of the semiconductor device 20.

The back side contact plug 203 formed on the $2^{nd}$ surface 2S of $1^{st}$ p-region of the vPNP 100C may be connected to a positive voltage source through a back side metal pattern 205 formed in the back side layer BL at a substantially same level as the two BSPDN structures 101 and 102, according to an embodiment. The $1^{st}$ BEOL contact plug 204-1 formed on the $1^{st}$ surface 1S of the $2^{nd}$ p-region P2 may be connected to another circuit element (not shown) of the semiconductor device 20 or another device (not shown). The $2^{nd}$ BEOL contact plug 204-2 formed on the $1^{st}$ surface 1S of the n-region N may be connected to still another circuit element (not shown) of the semiconductor device 20 or still another device (not shown), according to an embodiment.

The back side contact plug 203, the two BEOL contact plugs 204-1, 204-2 and the backside metal pattern 205 may be formed of the same material or different materials selected from among Cu, Ti, Ta, Al, W, Co, MO, Ru, etc.

The present embodiment shown in FIG. 2 may also enable prevention of routing congestion at the BEOL side of the semiconductor device 20 by forming the BSPDN structures 101 and 102 in the BSPDN layer, and further, utilizing a space at a lateral side of the $1^{st}$ transistor 100A or the $2^{nd}$ transistor 100B, or between the two transistors 100A and 100B above the back side layer BL of the semiconductor device 20.

In the meantime, the diode 100C or the vPNP 200C may also be formed at a space between the two BSPDN structures 101 and 102, that is, in the back side layer BL of the semiconductor device 10 or 20, respectively, according to an embodiment described below.

Figure 3:
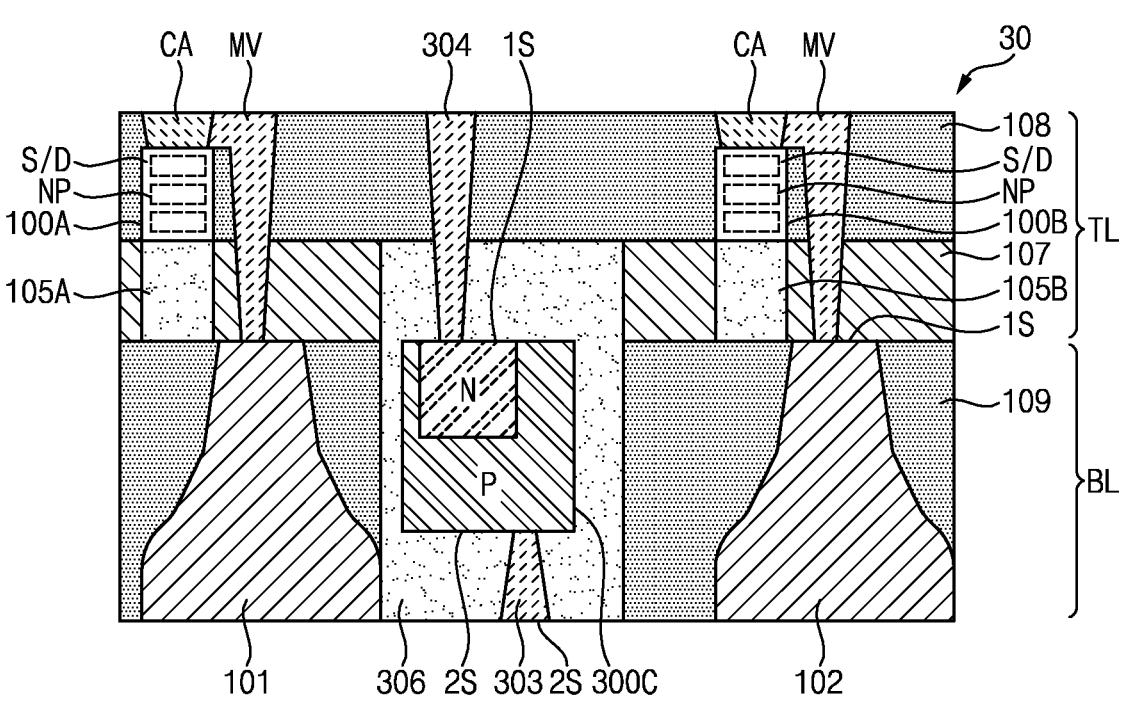
FIG. 3 illustrates a cross-section view of a semiconductor device structure including two transistors and a PN junction device at a lateral side of a BSPDN structure, according to an embodiment.

FIG. 3 illustrates a cross-section view of a semiconductor device structure including two transistors and a PN junction device at a lateral side of a BSPDN structure, according to an embodiment.

Referring to FIG. 3, a semiconductor device 30 according to an embodiment may have the same $1^{st}$ transistor 100A and $2^{nd}$ transistor 100B and connection structures thereof included in the semiconductor device 10 of FIG. 1. However, the semiconductor device 30 may differ from the semiconductor device 10 at a diode 300C, connection structures thereof and a $3^{rd}$ substrate structure 306 in which the diode 300C is formed. Thus, descriptions about the $3^{rd}$ semiconductor device 30 herebelow are directed to the diode 300C, its connection structures and the $3^{rd}$ substrate structure 306, while duplicate descriptions about the same structural elements included in the two semiconductor devices 10 and 30 are limited or omitted.

Compared to the semiconductor device 10 where the diode 100C may be formed at the substantially same level as the two transistors 100A and 100B in the transistor layer TL above the back side layer BL, the semiconductor device 30 may include the diode 300C at a substantially same level as the BSPDN structures 101 and 102 in the back side layer BL, according to an embodiment. Thus, the semiconductor device 30 may be disposed at a lateral side of the $1^{st}$ BSPDN structure 101 or the $2^{nd}$ BSPDN structure 102, or laterally between the two BSPDN structures 101 and 102 in the back side layer BL.

The $3^{rd}$ substrate structure 306 in the present embodiment may be disposed between divided two portions of the STI structure 107 and divided two portions of the $2^{nd}$ ILD structure 109. The $3^{rd}$ substrate structure 306 may be a portion of the initial substrate remaining after the two transistors 100A and 100B are formed in the transistor layer TL and the BSPDN structures 101 and 102 are formed in the back side layer. The diode 300C may be formed inside this $3^{rd}$ substrate structure 306 according to an embodiment. The diode 300C may be entirely buried in the $3^{rd}$ substrate structure 306 according to an embodiment.

Like the diode 100C of the semiconductor device 10, the diode 300C may also include a p-region P and an n-region N respectively doped with one or more p-type impurities and one or more n-type impurities to form a PN junction. Alternatively, the diode 300C may be epitaxially grown in the $3^{rd}$ substrate structure 306.

For connection of the diode 300C to a voltage source or another circuit element, a back side contact plug 303 and a BEOL (or MOL) via 304 may be formed on the diode 300C, according to an embodiment. The back side contact plug 303 may be formed at a lower portion of the back side of the semiconductor device 30 in the back side layer BL where the BSPDN structures 101 and 102 are formed, and the BEOL contact via 304 may be formed at a side opposite to the back side of the semiconductor device 30 in the transistor layer TL where the two transistors 100A and 100B are formed.

According to an embodiment, the back side contact plug 303 may be formed on a $2^{nd}$ surface 2S of the p-region P of the diode 300C to provide a positive voltage to the diode 300C. According to an embodiment, a $2^{nd}$ surface 2S of the back side contact plug 304 may be coplanar with a $2^{nd}$ surface 2S of the $3^{rd}$ substrate structure 306 exposed to an outside of the semiconductor device 30. The $2^{nd}$ surface 2S of the back side contact plug 304 may also be coplanar with $2^{nd}$ surfaces 2S of the $2^{nd}$ ILD structure 109 and the BSPDN structures 101 and 102. According to an embodiment, the BEOL contact via 304 may be formed on a $1^{st}$ surface 1S of the n-region N included in the p-region P to connect the diode 300C to another circuit element (not shown) of the semiconductor device 30 or another device (not shown). The $1^{st}$ surface 1S of the n-region N may be coplanar with a $1^{st}$ surface 1S of the p-region P in the $3^{rd}$ substrate structure 306. The BEOL contact via 304 may be extended through the $3^{rd}$ substrate structure 306 and the $1^{st}$ ILD structure 108 to a level of the $1^{st}$ surfaces 1S of $1^{st}$ ILD structure 108, the source/drain region contact plug CA and the MOL via MV which are coplanar with one another, according to an embodiment.

The semiconductor device 30 according to the present embodiment may enable at least utilization of a space at the back side layer BL for forming a PN junction device such as the diode 300C. As may be readily ascertained, other PN junction type devices (such as PNP devices) may be similarly disposed.

Herebelow, methods of manufacturing the semiconductor device 10 and the semiconductor device 30 according to an embodiment will be described.

FIGS. 4A to 4G illustrate cross-sectional views of a method for manufacturing a semiconductor device including two transistors and a PN junction device above a BSPDN structure, according to an embodiment. FIG. 5 illustrates a flowchart of the method described in reference to FIGS. 4A to 4G, according to embodiments.

It is understood here that FIGS. 4A to 4G and FIG. 5 show a plurality of operations of the method for manufacturing the semiconductor device 10 shown in FIG. 1, and these operations may not be limited to the order presented herein.

Figure 4A:
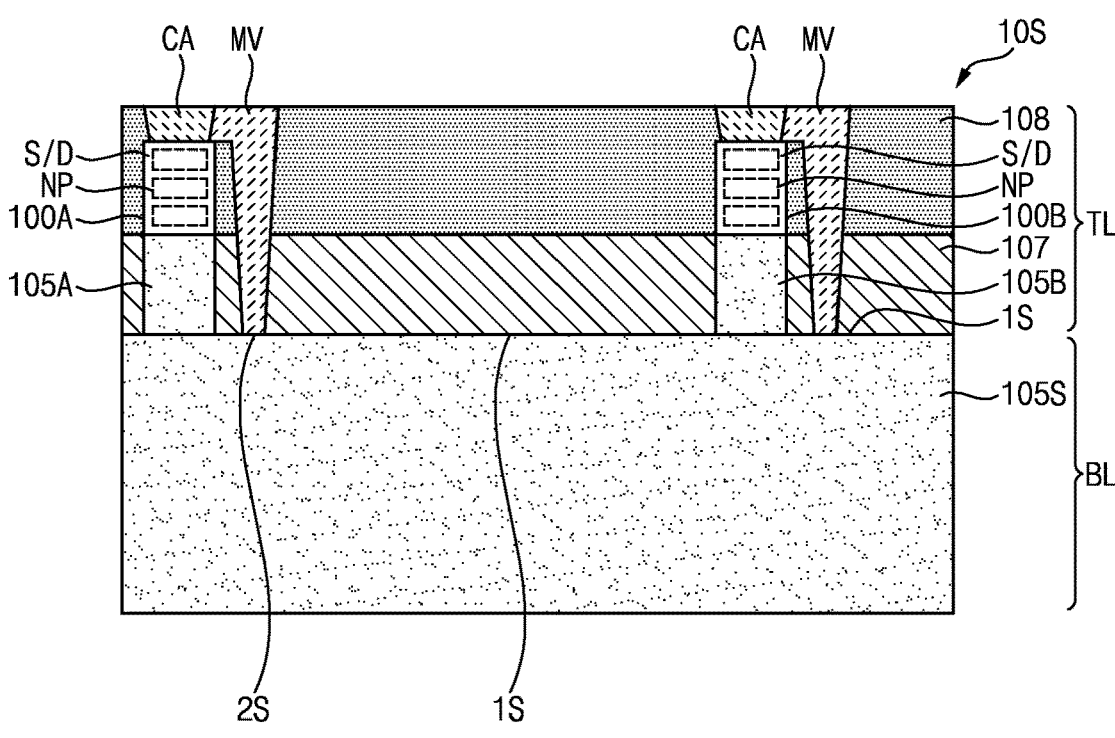
FIGS. 4A to 4G illustrate cross-sectional views of a method for manufacturing a semiconductor device including two transistors and a PN junction device above a BSPDN structure, according to an embodiment.

Referring to FIG. 4A, a semiconductor device structure may be formed at a transistor layer on a substrate to include two transistors, connection structures thereof, and an STI structure and a $1^{st}$ ILD structure that isolate the two transistors from each other (S10 in FIG. 5).

According to an embodiment, a $1^{st}$ transistor 100A and a $2^{nd}$ transistor 100B may be formed at a transistor layer TL based on an initial substrate 105S, and insulated by an STI structure 107 and a $1^{st}$ ILD structure 108 formed on the STI structure 107, thereby forming a semiconductor device structure 10S. The substrate 105S may be formed of a semiconductor material such as Si, or may be an SOI substrate. The STI structure 107 and the $1^{st}$ ILD structure 108 may be formed of one or more low-k materials, e.g., SiO, SiN, SiON, etc., but these two structures may be formed of respectively different materials.

Each of the two transistors 100A and 100B shown in FIG. 4A may include a plurality of nanosheet patterns NP epitaxially grown from the substrate 105S, and a source/drain region S/D epitaxially grown from the nanosheet patterns NP and the substrate 105S. FIG. 4A also shows a $1^{st}$ substrate structure 105A and a $2^{nd}$ substrate structure 105B that may have remained after the nanosheet patterns NP and the source/drain regions S/D are grown from the substrate 105S.

In this operation, a source/drain region contact plug CA may be formed on the source/drain region S/D, and an MOL via MV may be connected to the source/drain region contact structure CA to be extended down to a $1^{st}$ surface 1S of the substrate 105S. The source/drain region contact plug CA and the MOL via MV may be formed of one or more same materials or different materials selected from among Cu, Ti, Ta, Al, W, Co, Mo, Ru, etc.

Figure 4B:
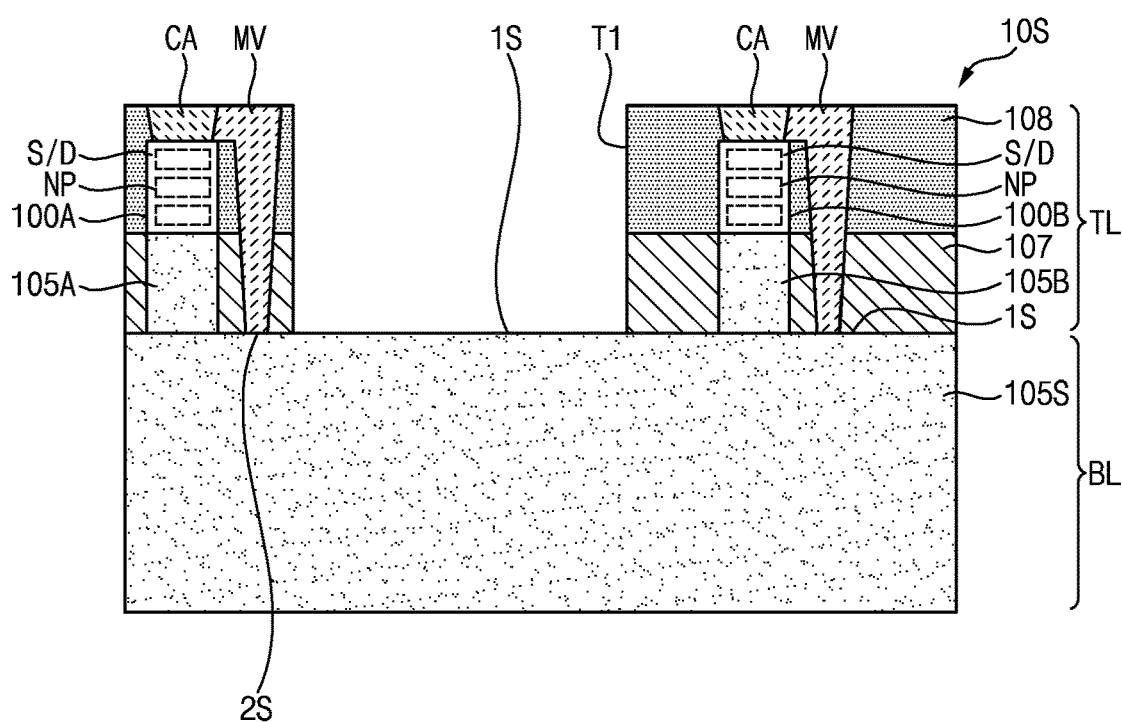

Referring to FIG. 4B, a $1^{st}$ trench may be formed in the transistor layer by etching a portion of the STI structure and the $1^{st}$ ILD structure between the two transistors on the substrate (S20 in FIG. 5).

According to an embodiment, a $1^{st}$ trench T1 may be formed in the transistor layer TL by etching a portion of the $1^{st}$ ILD structure 108 and a portion of the STI structure 107 below the $1^{st}$ ILD structure 108 to expose a $1^{st}$ surface 1S of the substrate 105S between the two transistors 100A and 100B. This $1^{st}$ trench T1 may provide a space where a substrate structure to encompass a diode is formed on the $1^{st}$ surface 1S of the substrate 105S in a later operation. The etching operation used to form the $1^{st}$ trench T1 may be a dry etching, not being limited thereto.

Here, the $1^{st}$ surface 1S of the substrate 105 may be a borderline between the transistor layer TL, where the two transistors 100A and 100B are formed and isolated from each other by the STI structure 107 and the $1^{st}$ ILD structure 108, and a back side layer BL where the substrate 105S is currently formed before it is replaced by one or more BSPDN structures and an additional ILD structure in a later operation. The $1^{st}$ surface 1S of the substrate 105 may also be at a same level as a $2^{nd}$ surface 2S of the MOL via MV contacting the substrate 105S. That is, the MOL via MV may be extended down from a level of the source/drain region contact plug CA to the level of the $1^{st}$ surface 1S of the substrate 105S.

Figure 4C:
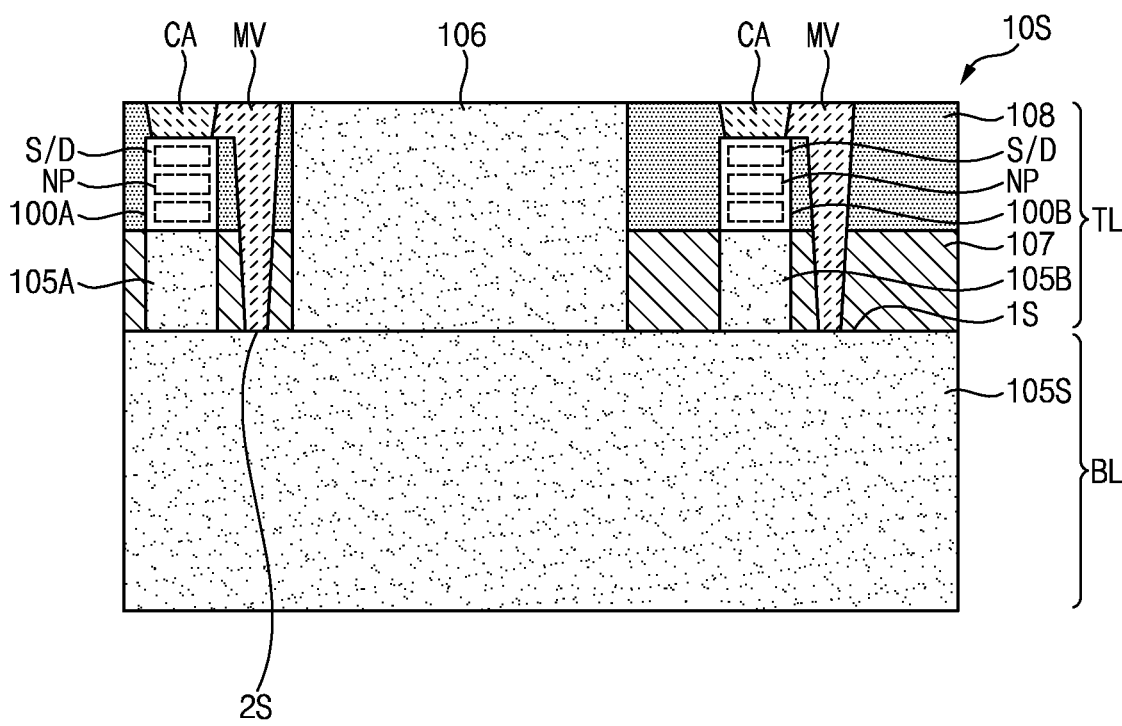

Referring to FIG. 4C, a substrate structure for diode formation may be formed in the $1^{st}$ trench between the two transistors (S30 in FIG. 5).

In this operation, a $3^{rd}$ substrate structure 106 which may include the same material forming the substrate 105S or a different material such as a-Si may be formed in the $1^{st}$ trench T1 by, for example, chemical vapor deposition (CVD) or plasma-enhanced CVD (PECVD), etc. As will be described in a later operation, this $3^{rd}$ substrate structure 106 may be provided to implant a diode therein at a side of one of the two transistors 100A and 100B or between the two transistors 100A and 100B in the transistor layer TL.

Figure 4D:
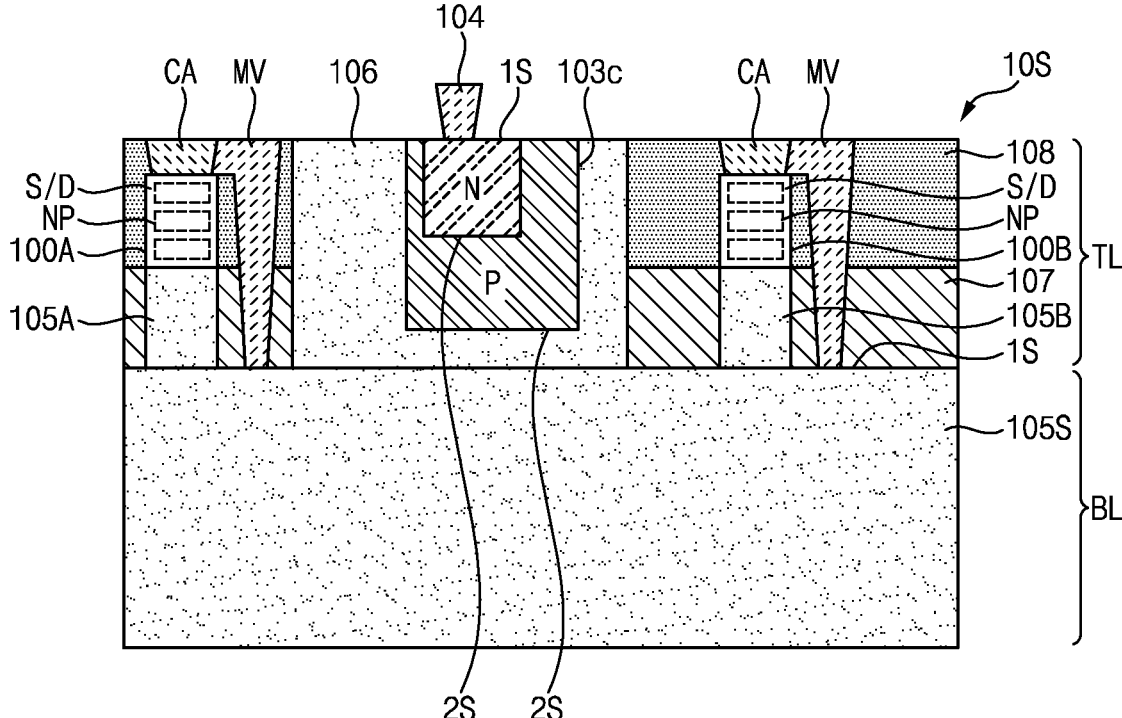

Referring to FIG. 4D, a diode may be formed in the substrate structure and a BEOL contact plug may be formed on the diode (S40 in FIG. 5).

According to an embodiment, a diode 103C may be implanted in the $3^{rd}$ substrate structure 106 by doping a p-region P and an n-region N inside the $3^{rd}$ substrate structure 106 to form a PN junction. The p-region P may be doped with one or more p-type impurities such as B, Ga, In, Al, etc., and the n-region N may be doped with one or more n-type impurities such as P, As, and Sb, etc. Thus, the diode 103C may be disposed at a side of the $1^{st}$ transistor 100A or the $2^{nd}$ transistor 100B, or between the two transistors 100A and 100B at a substantially same level in the transistor layer TL.

By this formation, a $2^{nd}$ surface 2S of the p-region P may be disposed inside the $3^{rd}$ substrate structure 106, and $1^{st}$ surfaces 1S of the p-region P and the n-region N may be exposed to an outside of the semiconductor device structure 10S. A $2^{nd}$ surface 2S of the n-region N may be disposed inside the p-region P. Thus, the $1^{st}$ surfaces of the p-region P, the n-region N, the $3^{rd}$ substrate structure 106, the source/drain region contact plug CA, the MOL via MV and the $1^{st}$ ILD structure 108 may be coplanar with one another to form a $1^{st}$ surface 1S of the semiconductor device structure 10S.

Further, a BEOL contact plug 104 may be formed on the $1^{st}$ surface 1S of the n-region N to connect the diode 100C to a voltage source or another circuit element. The BEOL contact plug 104 may be formed of at least one of Cu, Ti, Ta, Al, W, Co, Mo, Ru, etc., and the formation of the BEOL contact plug 104 may be performed through, for example, a single damascene process.

Figure 4E:
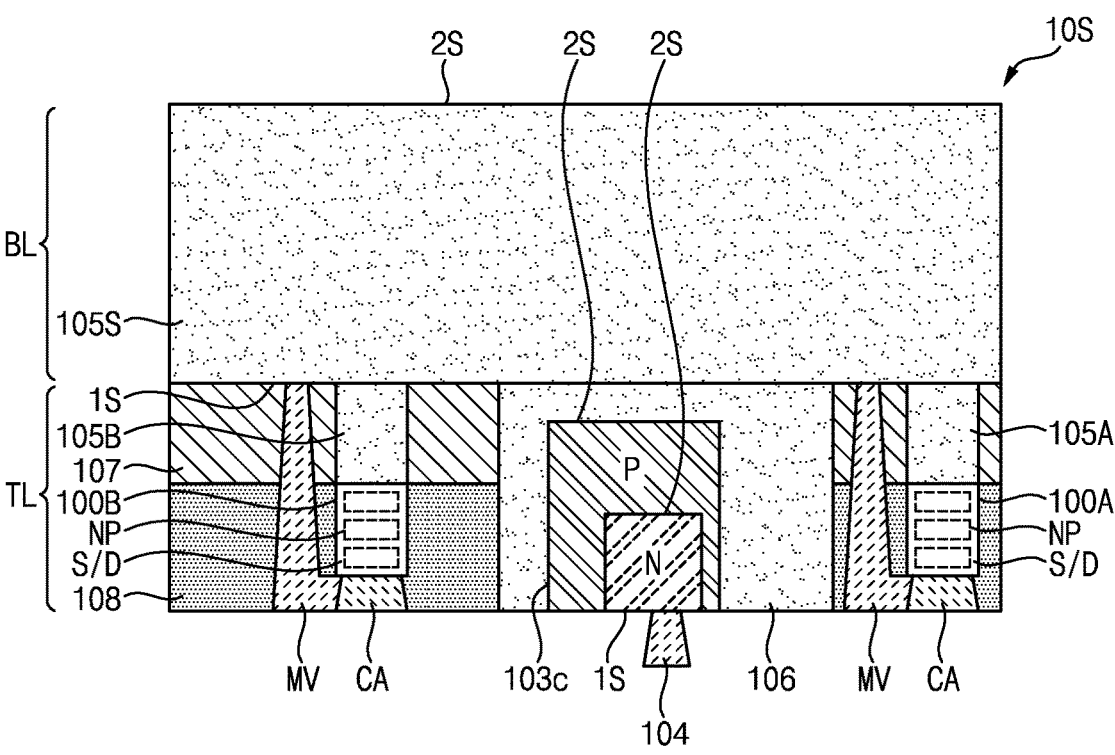

Referring to FIG. 4E, the semiconductor device structure obtained in the previous operation may be flipped upside down to form a BSPDN structure in a later operation (S50 in FIG. 5).

In this operation, the semiconductor device structure 10S obtained in the operation shown in FIG. 4D may be flipped upside down to place a $2^{nd}$ surface 2S of the substrate 105 to be directed upwardly so that formation of a BSPDN structure to the semiconductor device structure 10S may be facilitated in a later operation.

Figure 4F:
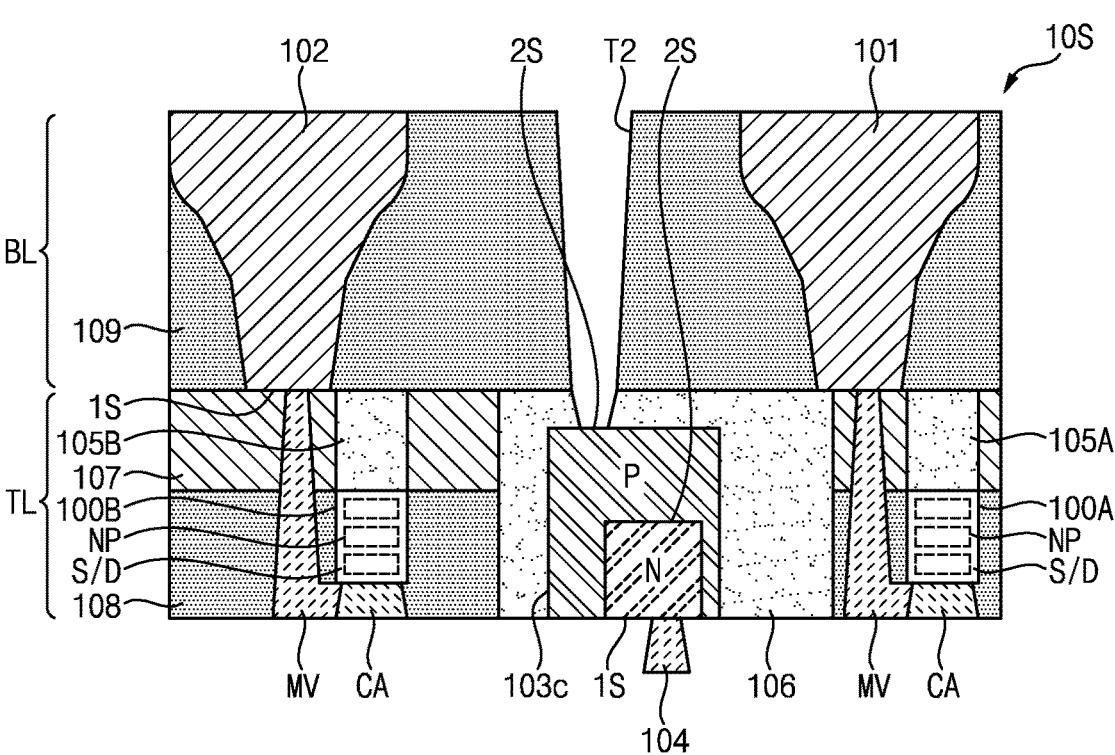

Referring to FIG. 4F, the substrate of the semiconductor device structure may be removed, and instead, a $2^{nd}$ ILD structure, a $1^{st}$ BSPDN structure and a $2^{nd}$ BSPDN structure may be formed in a back side layer to replace the substrate, and a $2^{nd}$ trench to form a back side metal pattern for the diode may be formed in the $2^{nd}$ ILD structure (S60 in FIG. 5).

According to an embodiment, the substrate 105s may be removed by, for example, dry etching, planarization, etc., and a $2^{nd}$ ILD structure 109 may be formed in the back side layer BL by, for example, CVD, PECVD, etc. Further, a $1^{st}$ BSPDN structure 101 and a $2^{nd}$ BSPDN structure 102 may be formed in the $2^{nd}$ ILD structure 109 to be connected to the $1^{st}$ transistor 100A and the $2^{nd}$ transistor 100B thought the MOL vias MV, respectively by etching and deposition processes.

The BSPDN structures 101 and 102 may be formed of one or more materials from among Cu, Ti, Ta, Al, W, Co, Mo, Ru, etc., and the $2^{nd}$ ILD structure 109 may be formed of one or more materials that are the same as of different from the materials forming the $1^{st}$ ILD structure 108

Although the substrate 105S is removed in this operation, portions of the substrate 105S, that is, the $1^{st}$ substrate structure 105A and the $2^{nd}$ substrate structure 105B may remain as shown in FIG. 4F, according to an embodiment. However, the disclosure is not limited thereto, and these substrate structures 105A and 105B may be removed in a separate operation to prevent an undesired diffusion of the semiconductor material included in the substrate structure 105A and 105B toward the MOL via MV or the BSPDN structures 101 and 102.

Also in this operation, a $2^{nd}$ trench T2 may be formed to penetrate through the $2^{nd}$ ILD structure 109 and a portion of the $3^{rd}$ substrate structure 106 to expose a $2^{nd}$ surface 2S of the p-region P of the diode 100C.

Figure 4G:
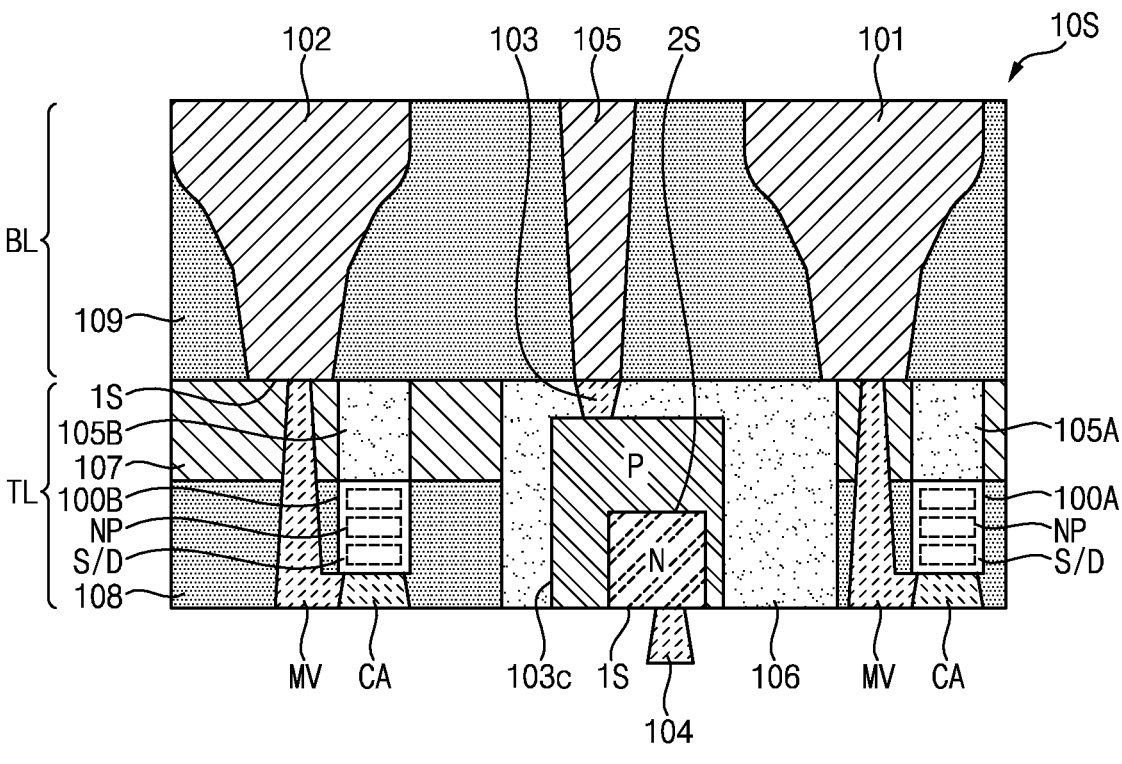

Referring to FIG. 4G, a back side contact plug and a back side metal pattern may be formed in the $2^{nd}$ trench to complete a semiconductor device (S70 in FIG. 5).

According to an embodiment, a back side contact plug 103 may be formed on the $2^{nd}$ surface 2S of the p-region P of the diode 100C through the $2^{nd}$ trench T2, and then, a back side metal pattern 105 may fill the $2^{nd}$ trench T2 to connect the p-region P of the diode 100C to a voltage source through the back side contact plug 103.

The back side contact plug 103 and the back side metal pattern 105 may be formed of the same material of different materials selected from among Cu, Ti, Ta, Al, W, Co, MO, Ru, etc.

In the above embodiments, the back side contact plug 103 and the back side metal pattern 105 may be formed in operation S70 separately from operation S60 in which the two BSPDN structures 101 and 102 are formed. However, these metal patterns may be formed in a same operation, that is, operation S60, according to an embodiment.

It is understood that the semiconductor device 10S shown in FIG. 4G may be flipped upside down again to be the semiconductor device 10 shown in FIG. 1. It is also understood that the semiconductor device 20 shown in FIG. 2 may be manufactured in a similar method described above.

FIGS. 6A to 6F illustrate cross-sectional views of a method for manufacturing a semiconductor device including two transistors and a PN junction device at a lateral side of a BSPDN structure, according to an embodiment. FIG. 7 illustrates a flowchart of the method described in reference to FIGS. 6A to 6F, according to embodiments.

It is understood here that FIGS. 6A to 6F and FIG. 7 show a plurality of operations of the method for manufacturing the semiconductor device 30 shown in FIG. 3, and these operations may not be limited to the order presented herein.

Figure 6A:
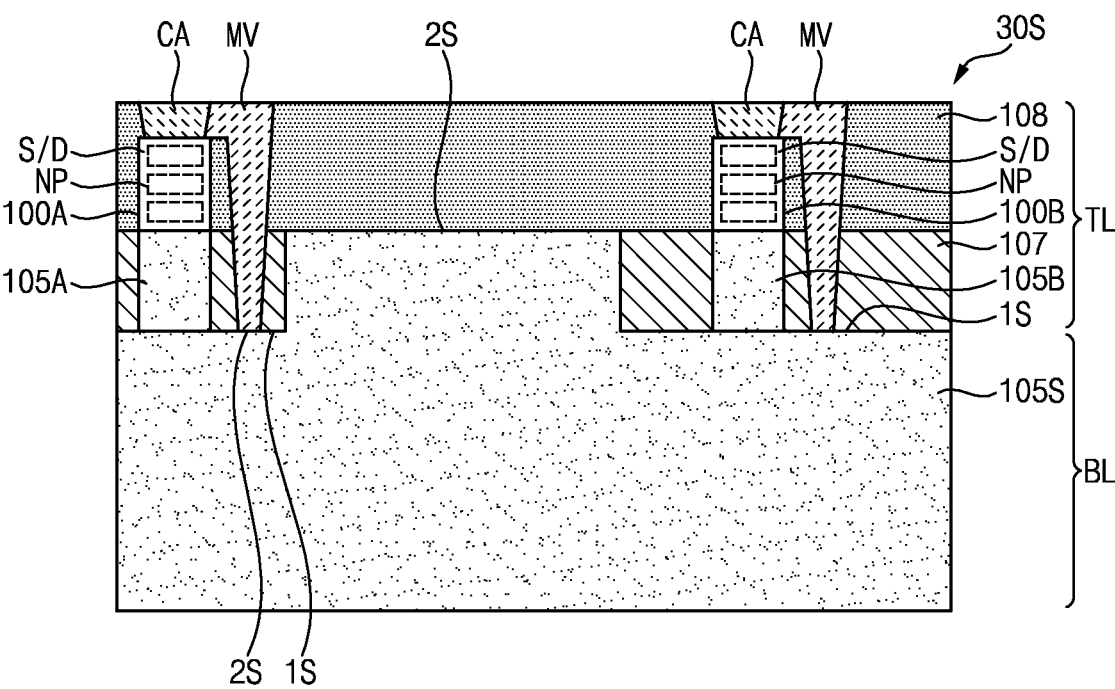
FIGS. 6A to 6F illustrate cross-sectional views of a method for manufacturing a semiconductor device including two transistors and a PN junction device at a lateral side of a BSPDN structure, according to an embodiment.

Referring to FIG. 6A, a semiconductor device structure may be formed at a transistor layer on a substrate to include two transistors, connection structures thereof, and an STI structure and a $1^{st}$ ILD structure that isolate the two transistors from each other (S100 in FIG. 7).

According to an embodiment, a semiconductor device structure 30S provided in this operation may include the same transistor structures included in the semiconductor device structure 10S as shown in FIG. 4A. These transistor structures include the $1^{st}$ transistor 100A, the $2^{nd}$ transistor 100B, the source/drain region contact plug CA, the MOL via MV, the STI structure 107, and the $1^{st}$ ILD structure 108 in a transistor layer TL. Thus, descriptions thereof may be limited or omitted herebelow.

However, the semiconductor device structure 30S shown in FIG. 6A may differ from the semiconductor device structure 10 shown in FIG. 4A in that the STI structure 107 is divided by a portion of the substrate 105S protruded from a level of a $1^{st}$ surface 1S of the substrate 105S on which the STI structure 107 is formed. This structural difference may occur by forming the STI structure 107 in the substrate 105S only at limited areas around the two transistors 100A and 100B. Thus, a $2^{nd}$ surface of the substrate 105S at the protruded portion may contact a $2^{nd}$ surface 2S of the $1^{st}$ ILD structure 108 in FIG. 6A, while a $2^{nd}$ surfaces 2S of the MOL vias MV contact the $1^{st}$ surface 1S of the substrate 105S, as shown in FIG. 6A.

Figure 6B:
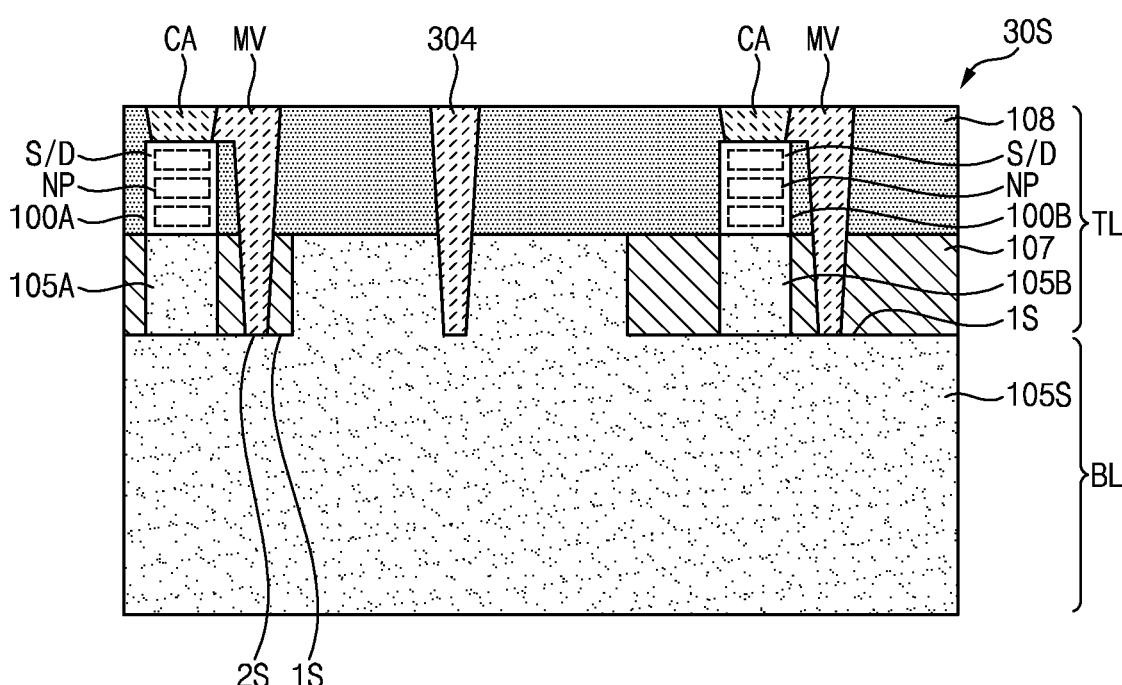

Referring to FIG. 6B, a BEOL (or MOL) via may formed to penetrate the $1^{st}$ ILD structure and an upper portion of the substrate between the two transistors in the transistor layer (S200 in FIG. 7).

According to an embodiment, a BEOL (or MOL) via hole may be formed in the transistor layer TL by etching the $1^{st}$ ILD structure 108 and the protruded portion of the substrate 105S below the $1^{st}$ ILD structure 108 so that a bottom surface of the BEOL via hole reaches a level of the $1^{st}$ surface 1S of the substrate 10S which is the same as a level of the $2^{nd}$ surface 2S of the MOL via MV.

Once the BEOL via hole is formed, one or more materials selected from Cu, Ti, Ta, Al, W, Co, Mo, Ru, etc. may be filled in the BEOL via hole to form a BEOL via 304 penetrating the $1^{st}$ ILD structure 108 and the protruded portion of the substrate 105S to reach the level of the $1^{st}$ surface 1S of the substrate 10S and the level of the $2^{nd}$ surface 2S of the MOL via MV.

As will be described later, the BEOL via 304 may be connected to a diode 300C to be formed at a back side layer BL in a later operation.

Figure 6C:
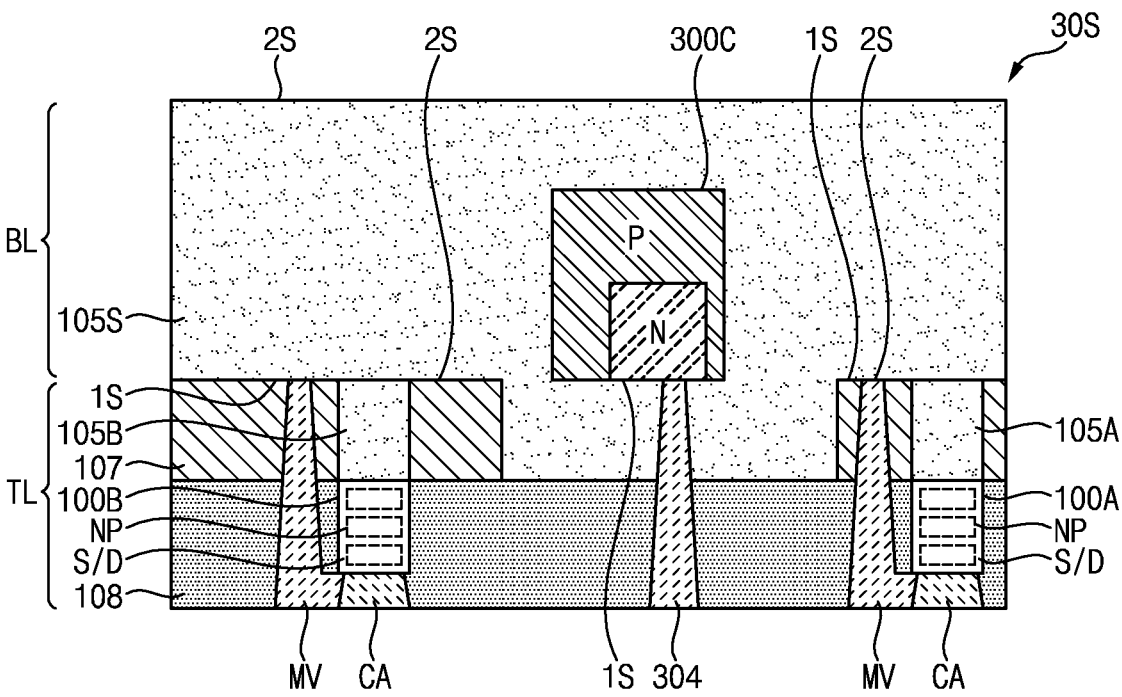

Referring to FIG. 6C, the semiconductor device structure may be flipped upside down, and a diode may be formed at a back side layer in the substrate to be connected to the BEOL via (S300 in FIG. 7).

According to an embodiment, a diode 300C may be implanted in the substrate 105S by doping a p-region P and an n-region N inside the substrate 105S to form a PN junction. The p-region P may be doped with one or more p-type impurities, and the n-region N may be doped with one or more n-type impurities.

By this formation of the diode 300C in the substrate 105S, the diode 300C may be formed at the back side layer BL where the BSPDN structures 101 and 102 are to be formed for connection to the two transistors 100A and 100B, respectively. For example, a $1^{st}$ surface 1S of the diode 300C may be at a level of a $2^{nd}$ surface 2S of the STI structure 107.

Figure 6D:
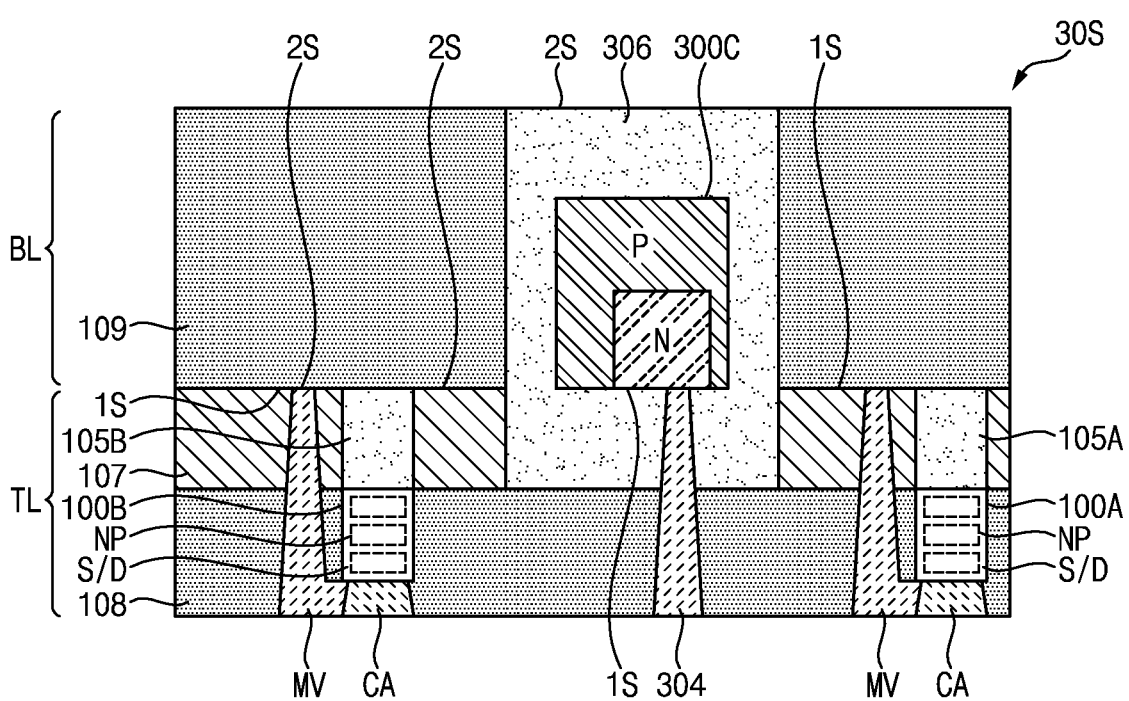

Referring to FIG. 6D, the substrate is etched to leave a portion thereof in which the diode is formed, and a $2^{nd}$ ILD structure is formed to replace the removed portion of the substrate (S400 in FIG. 7).

In this operation, the substrate 105S is etched from a $2^{nd}$ surface 2S thereof to leave a portion of the substrate 105S, which becomes a $3^{rd}$ substrate structure 306, in which the diode 300C is implanted, and the removed portion of the substrate 105S may be replaced by a $2^{nd}$ ILD structure 109 by, for example, CVD, PECVD, etc. The $2^{nd}$ ILD structure 109 may be formed of one or more materials that are the same as or different from the materials of the b $1^{st}$ ILD structure 108.

When the $2^{nd}$ ILD structure 109 is formed, a $1^{st}$ surface of the $2^{nd}$ ILD structure 109 may contact the $2^{nd}$ surface 2S of the STI structure 107 and a $2^{nd}$ surface 2S of the MOL via MV. Here, the layer where the $2^{nd}$ ILD structure 109 is formed may be a back side layer of the semiconductor device structure 10S.

Thus, the $3^{rd}$ substrate structure 306 including the diode 300C therein may be laterally interposed between two portions of the $2^{nd}$ ILD structure 109 formed above the two transistors 100A and 100B, respectively.

Figure 6E:
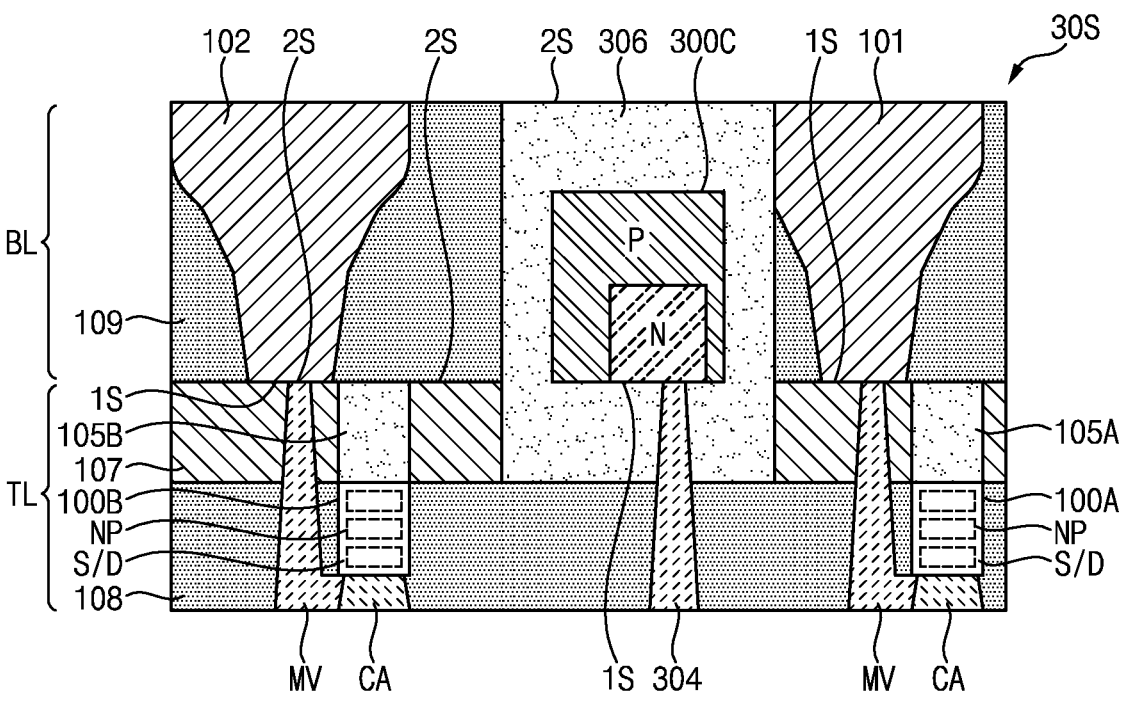

Referring to FIG. 6E, two portions of the $2^{nd}$ ILD structure may be etched to form a $1^{st}$ BSPDN structure and a $2^{nd}$ BSPDN structure connected to the two transistors (S500 in FIG. 7)

While the two portions of the $2^{nd}$ ILD structure 109 obtained in the previous operation are disposed on the $2^{nd}$ surfaces 2S of corresponding portions of the STI structure 107 and the MOL via MV, the two portions of the $2^{nd}$ ILD structure 109 may be etched down from a $2^{nd}$ surface 2S thereof to provide two trenches for the two BSPDN structures 101 and 102 at the back side layer BL.

After the two trenches are formed, the $1^{st}$ BSPDN structure 101 and the $2^{nd}$ BSPDN structure 102 may be formed in the two trenches to be connected to the $1^{st}$ transistor 100A and the $2^{nd}$ transistor 100B through the MOL vias MV, respectively.

The two BSPDN structures 101 and 102 may be formed of one or more materials selected from among Cu, Ti, Ta, Al, W, Co, Mo, Ru, etc.

Figure 6F:
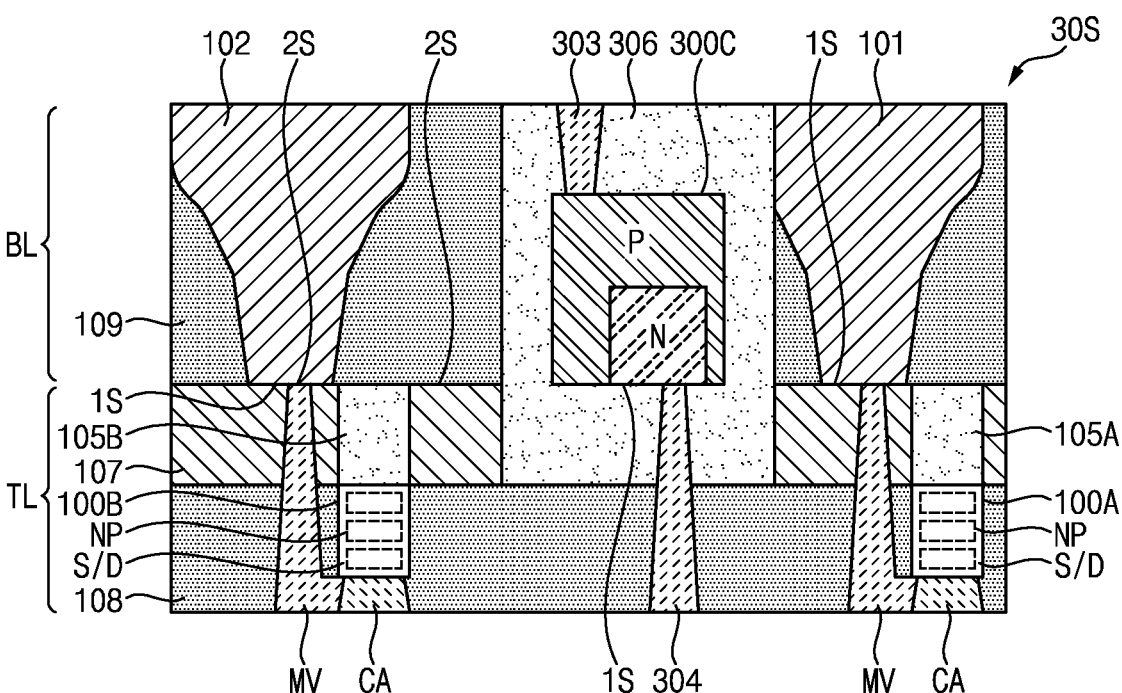

Referring to FIG. 6F, a back side contact plug is formed to be connected to the diode to complete a semiconductor device (S600 in FIG. 7).

As shown in FIG. 6F, a back side via hole is formed from a $2^{nd}$ surface 2S of the $3^{rd}$ substrate structure 306 to expose the p-region P of the diode 300C in the $3^{rd}$ substrate structure 306, and a back side contact plug 303 may be formed in the back side via hole to connect the diode 300C to a voltage source.

The back side contact plug 307 may also be formed of one or more materials selected from among Cu, Ti, Ta, Al, W, Co, Mo, Ru, etc.

It is understood that the semiconductor device 30S shown in FIG. 6F may be flipped upside down again to form the semiconductor device 30 shown in FIG. 3.

Figure 8:
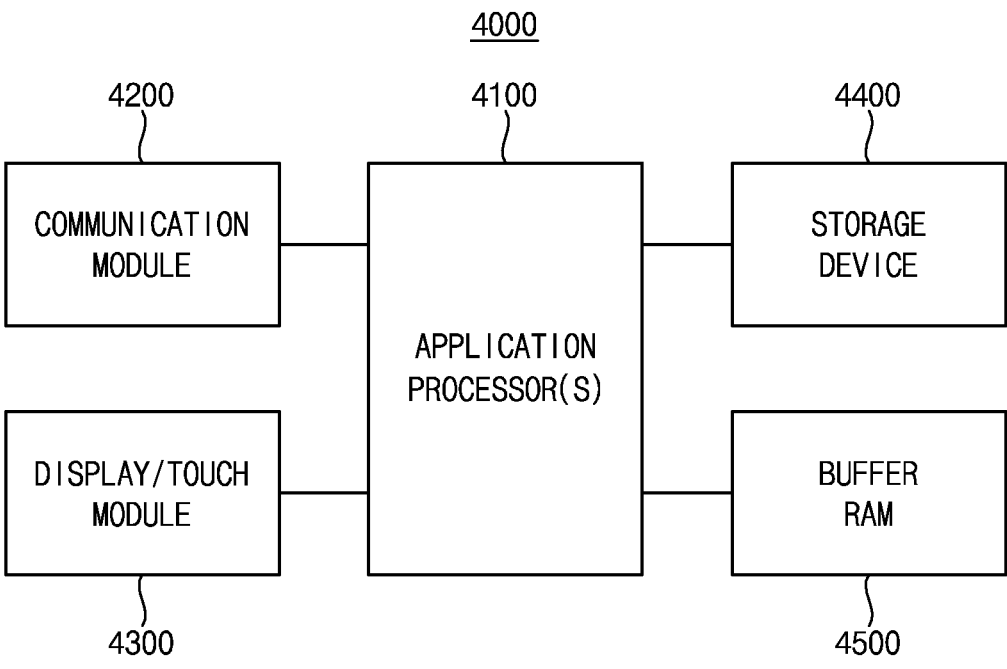
FIG. 8 is a schematic block diagram illustrating an electronic device including a semiconductor device in which a passive device or a PN junction device is formed as shown in FIG. 1, 2 or 3, according to an example embodiment.

FIG. 8 is a schematic block diagram illustrating an electronic device including a semiconductor device in which a passive device or a PN junction device is formed as shown in FIG. 1, 2 or 3, according to an example embodiment.

Referring to FIG. 8, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 7, the electronic device 4000 may further include at least one sensor such as an image sensor. In this case, the two transistors 100A and 100B shown in FIGS. 1 to 3 may constitute a complementary-metal-oxide-semiconductor (CMOS) device, and the image sensor of the electronic device 400 may be a CMOS image sensor, according to an embodiment. Here, the $1^{st}$ transistor 100A may be one of a p-type metal-oxide-semiconductor (PMOS) device and an n-type metal-oxide-semiconductor device (NMOS) device, and the $2^{nd}$ transistor 100B may also be one of a p-type metal-oxide-semiconductor (PMOS) device and an n-type metal-oxide-semiconductor device (NMOS) device. The diode 100C or 300C may form a photodiode of the CMOS image sensor.

At least one component in the electronic device 4000 may include at least one of the semiconductor device 10, 20 and 30 shown in FIGS. 1 to 3.

The foregoing is illustrative of exemplary embodiments and is not to be construed as limiting the inventive concept. Although a few exemplary embodiments have been described, those skilled in the art will readily appreciate that many modifications are possible in the above embodiments without materially departing from the inventive concept.

What is claimed is:

1. A semiconductor device comprising:
   at least one field-effect transistor in a $1^{st}$ layer including a first portion of a substrate, the $1^{st}$ layer being above a $2^{nd}$ layer that includes a second portion of the substrate;
   at least one back side power delivery network (BSPDN) structure;
   an interlayer dielectric (ILD) structure formed around the at least one BSPDN structure in the $2^{nd}$ layer and extending to an interface with the first portion of the substrate; and
   at least one PN junction device at a lateral side of the at least one BSPDN structure in the second portion of the substrate in the $2^{nd}$ layer,
   wherein the at least one BSPDN structure is configured to connect the at least one field-effect transistor to a voltage source.

2. A semiconductor device comprising:
   at least one field-effect transistor in a $1^{st}$ layer including a first portion of a substrate; and
   at least one back side power delivery network (BSPDN) structure and at least one PN junction device at a lateral side of the at least one BSPDN structure in a $2^{nd}$ layer that includes a second portion of the substrate, wherein the second layer is below the $1^{st}$ layer;
   an interlayer dielectric (ILD) structure formed around the at least one BSPDN structure in the $2^{nd}$ layer and extending to an interface with the first portion of the substrate,
   wherein the at least one BSPDN structure is configured to connect the at least one field-effect transistor to a voltage source,
   wherein the semiconductor device further comprises a $1^{st}$ substrate structure at the lateral side of the at least one BSPDN structure in the $2^{nd}$ layer, and
   wherein the at least one PN junction device is formed in the $1^{st}$ substrate structure.

3. The semiconductor device of claim 1, further comprising:
   a back side contact plug in the $2^{nd}$ layer, the back side contact plug connecting one of a p-region and an n-region of the at least one PN junction device to the voltage source or another circuit element; and
   a via metal pattern in the $1^{st}$ layer, the via metal pattern connecting the other of the p-region and the n-region of the at least one PN junction device to the voltage source or another circuit element.

4. The semiconductor device of claim 1, further comprising:

a $1^{st}$ substrate structure at the lateral side of the at least one BSPDN structure in the $2^{nd}$ layer, the at least one PN junction device being formed in the $1^{st}$ substrate structure; and a $2^{nd}$ substrate structure based on which a channel structure of the at least one field-effect transistor is formed, the $2^{nd}$ substrate structure being formed in the $1^{st}$ layer without being extended to the $2^{nd}$ layer.

5. The semiconductor device of claim 1, wherein the at least one field-effect transistor comprises two field-effect transistors, and wherein the at least one PN junction device is between the two field-effect transistors in the $2^{nd}$ layer.

6. A method of manufacturing a semiconductor device, the method comprising:

providing at least one field-effect transistor in a $1^{st}$ layer including a first portion of a substrate, the $1^{st}$ layer being above a $2^{nd}$ layer that includes a second portion of the substrate;

forming at least one PN junction device in the substrate in the $2^{nd}$ layer;

removing the substrate in the $2^{nd}$ layer except at the second portion where the at least one PN junction device is formed in the $2^{nd}$ layer, the at least one PN junction device being formed in the second portion of the substrate;

forming an interlayer dielectric (ILD) structure in the $2^{nd}$ layer that extends to an interface with the first portion of the substrate; and forming at least one back side power delivery network (BSPDN) structure at a lateral side of the at least one PN junction device in the $2^{nd}$ layer, the at least one BSPDN structure being formed in the ILD structure and being connected to the at least one field-effect transistor.

7. The method of claim 6, further comprising:

connecting the at least one BSPDN structure to the at least one PN junction device.

8. The semiconductor device of claim 1, further comprising a back side contact plug in the $2^{nd}$ layer, the back side contact plug connecting the at least one PN junction device to the voltage source or another circuit element, wherein the back side contact plug is in a via hole and on a surface of the at least one PN junction device.

9. The semiconductor device of claim 1, further comprising a back side contact plug in the $2^{nd}$ layer, wherein the back side contact plug is on a $2^{nd}$ surface of the at least one PN junction device, opposite a $1^{st}$ surface of the at least one PN junction device facing a front side of the semiconductor device where the at least one field-effect transistor is provided, and wherein the back side contact plug is connected to one of a p-region and an n-region of the at least one PN junction device.

10. The semiconductor device of claim 9, further comprising a front side contact plug in the $1^{st}$ layer, wherein the front side contact plug is on the $1^{st}$ surface of the at least one PN junction device, and wherein the front side contact plug is connected to the other of the p-region and the n-region of the at least one PN junction device.

11. The method of claim 6, further comprising forming a back side contact plug in a via hole and on a surface of the at least one PN junction device.

12. The method of claim 6, further comprising forming a back side contact plug on a $2^{nd}$ surface of the at least one PN junction device, opposite a $1^{st}$ surface of the at least one PN junction device facing a front side of the semiconductor device where the at least one field-effect transistor is provided, wherein the back side contact plug is connected to one of a p-region and an n-region of the at least one PN junction device.

13. The method of claim 12, further comprising forming a front side contact plug on the $1^{st}$ surface of the at least one PN junction device, wherein the front side contact plug is connected to the other of the p-region and the n-region of the at least one PN junction device.

* * * * *